United States Patent
Yanagisawa et al.

(10) Patent No.: US 11,100,989 B2
(45) Date of Patent: Aug. 24, 2021

(54) MULTIPLIER-ACCUMULATOR

(71) Applicant: FLOADIA CORPORATION, Kodaira (JP)

(72) Inventors: Kazumasa Yanagisawa, Kodaira (JP); Tomoichi Hayashi, Kodaira (JP); Satoshi Noda, Kodaira (JP); Yasuhiro Taniguchi, Kodaira (JP); Kosuke Okuyama, Kodaira (JP)

(73) Assignee: FLOADIA CORPORATION, Tokyo (JP)

( * ) Notice: Subject to any disclaimer, the term of this patent is extended or adjusted under 35 U.S.C. 154(b) by 0 days.

(21) Appl. No.: 16/769,390

(22) PCT Filed: Jul. 25, 2019

(86) PCT No.: PCT/JP2019/029299
§ 371 (c)(1),
(2) Date: Jun. 3, 2020

(87) PCT Pub. No.: WO2020/026947
PCT Pub. Date: Feb. 6, 2020

(65) Prior Publication Data
US 2020/0303003 A1      Sep. 24, 2020

(30) Foreign Application Priority Data

Aug. 2, 2018  (JP) .............................. JP2018-146297

(51) Int. Cl.
*G06F 9/38*    (2018.01)
*G11C 13/00*   (2006.01)

(52) U.S. Cl.
CPC .......... *G11C 13/004* (2013.01); *G06F 9/3893* (2013.01); *G11C 13/0026* (2013.01); *G11C 13/0028* (2013.01); *G11C 2013/0045* (2013.01)

(58) Field of Classification Search
CPC .............. G11C 13/004; G11C 13/0026; G11C 13/0028; G11C 2013/0045; G06F 9/3893
(Continued)

(56) References Cited

U.S. PATENT DOCUMENTS

2002/0028541 A1 * 3/2002 Lee ................... H01L 27/11556
                                                        438/149
2004/0061167 A1 * 4/2004 Mantha ................. H01L 27/115
                                                        257/315
(Continued)

FOREIGN PATENT DOCUMENTS

WO        2016-178392 A1    11/2016
WO    WO-2016178392 A1 *    11/2016    ........ H01L 29/40117

OTHER PUBLICATIONS

International Search Report issued in Patent Application No. PCT/JP2019/029299 dated Sep. 9, 2019.
(Continued)

*Primary Examiner* — Ly D Pham
(74) *Attorney, Agent, or Firm* — Pearne & Gordon LLP

(57) ABSTRACT

A multiply-accumulate operation apparatus is capable of sufficiently restraining a sneak current when employing a precharge method where the magnitude of an electric current flowing through an output line is detected. In a synapse operation section, memory cells storing respective synaptic connection weights are arranged in rows and columns. Output lines are connected to memory cells in the corresponding column, and input lines are connected to memory cells in the corresponding row. Each output line is precharged, and then its electric potential is decreased during the corresponding memory cells flow cell currents corresponding to their synaptic connection weights. A memory element of each memory cell includes a memory transistor, a drain side transistor, and a source side transistor connected in series, and is connected between the corresponding input
(Continued)

and output line. The memory transistor stores a synaptic connection weight according to the amount of charge in a charge storage layer.

10 Claims, 8 Drawing Sheets

(58) Field of Classification Search
USPC .......................................................... 365/148
See application file for complete search history.

(56) References Cited

U.S. PATENT DOCUMENTS

| | | | |
|---|---|---|---|
| 2011/0096588 A1* | 4/2011 | Fasoli | G11C 13/003 365/148 |
| 2012/0268980 A1* | 10/2012 | Awaya | H01L 27/2472 365/148 |
| 2017/0228345 A1* | 8/2017 | Gupta | G06F 17/16 |
| 2018/0181696 A1* | 6/2018 | Koh | G06F 30/367 |
| 2018/0308990 A1 | 10/2018 | Owada et al. | |
| 2019/0027217 A1* | 1/2019 | Strachan | G11C 13/003 |

OTHER PUBLICATIONS

Written Opinion issued in Patent Application No. PCT/JP2019/029299 dated Sep. 9, 2019.
Can Li, et al., "In-Memory Computing with Memristor Arrays", 2018 IEEE International Memory Workshop (IMW) Kyoto, 2018, pp. 1-4, doi: 10.1109/IMW.2018.8388838.

* cited by examiner

MULTIPLIER-ACCUMULATOR

TECHNICAL FIELD

The present invention relates to a multiply-accumulate operation apparatus.

BACKGROUND ART

Heretofore, a neural network imitating the information processing scheme of a brain has been under study, and various models have already been proposed. A typical model of a neuron constituting the neural network is one in which the sum of values obtained by weighting input values from other multiple neurons by synaptic connection weights corresponding to the respective input values is input to a neuron of the following stage. A neural network system based on this kind of model stores synaptic connection weights in memory elements and executes multiply-accumulate operation of input values from other neurons and the synaptic connection weights corresponding to the respective input values.

A multiply-accumulate operation apparatus is known which has a structure similar to that of a cross-point memory array and is configured to execute the multiply-accumulate operation as described above. In this multiply-accumulate operation apparatus, memory cells are respectively disposed at cross-points between respective sets of multiple input lines and multiple output lines intersecting with the input lines, and each memory cell is connected between the input line and the output line of the corresponding cross-point. Each memory cell has such a configuration that a resistance change element, such as a ReRAM (resistive random access memory), which is set at a resistance value corresponding to the synaptic connection weight and a diode which is configured to restrain a sneak current are connected in series. By changing the electric potentials of the multiple input lines corresponding to input values from other multiple neurons, an electric current with a magnitude corresponding to the result of multiply-accumulate operation flows through each output line. According to such a configuration, high-speed operation and power consumption reduction can be expected.

Meanwhile, there is also known a multiply-accumulate operation apparatus in which a memory cell has a 1T1R configuration such that a memristor and a MOS transistor configured to restrain a sneak current are connected in series (see NPL 1). The multiply-accumulate operation apparatus described in this NPL 1 extracts an electric current with a magnitude corresponding to the result of multiply-accumulate operation from each output line by applying a voltage pulse to each input line in a state where a predetermined voltage is applied to the gate of each MOS transistor.

CITATION LIST

Non Patent Literature

NPL 1: Can Li et al., "In-Memory Computing with Memristor Arrays", 2018 IEEE International Memory Workshop (IMW) pp. 161-164

SUMMARY OF INVENTION

Technical Problem

In the multiply-accumulate operation apparatus as described above, a sneak current flowing through a memory cell to which no input is applied turns to noise on the result of multiply-accumulate operation and causes breakage of the operation result. Since there are a quite large number of memory cells in the neural network, even when only a small amount of sneak current flows through one memory cell, the amount of sneak current flowing through the memory cells might be large as a whole. Thus, it is important to sufficiently restrain a sneak current in each of the memory cells for executing the multiply-accumulate operation precisely.

Meanwhile, for a method that detects the magnitude of an electric current flowing through an output line of the multiply-accumulate operation apparatus as described above, a precharge system is advantageous in terms of power consumption reduction. In the precharge method, the capacitance of an output line is charged to a predetermined potential in advance and, at the time of multiply-accumulate operation, the output line is discharged via a memory cell and the electric potential of the output line at this time is acquired as the result of multiply-accumulate operation. However, if the precharge method is combined with the configuration of a memory cell as described in NPL 1, it is not possible to restrain a sneak current. This is because, along with a decrease in the electric potential of the output line at the time of the multiply-accumulate operation, a MOS transistor gets turned on in a memory cell to which no input is applied and a sneak current flows through this memory cell.

In the case of restraining a sneak current with a diode, no failure as observed in a MOS transistor occurs even when the precharge method is employed. However, in order to sufficiently restrain a sneak current with a diode, that means the ON/OFF characteristics of a diode needs to be enhanced, which results in an increase in size of each diode and a decrease of integration density. Such a decrease of integration density in the case of using a diode is observed irrespective of using any type of diode, and therefore it is practically difficult to sufficiently restrain a sneak current with a diode.

The present invention has been made inconsideration of the above circumstances, and aims to provide a multiply-accumulate operation apparatus capable of sufficiently restraining a sneak current even when it employs a precharge method in which the magnitude of an electric current flowing through an output line is detected.

Solution to Problem

A multiply-accumulate operation apparatus according to the present invention includes: multiple memory cells each of which has a resistance change element with a variable resistance value and which are arranged in a matrix of rows and columns; multiple input lines which are arranged so as to correspond to the respective rows and each of which is connected to the memory cells in the corresponding row; multiple output lines which are arranged so as to correspond to the respective columns, each of which is connected to the memory cells in the corresponding column, and in each of which the magnitude of an electric current that flows therethrough when the electric potentials of the multiple input lines are changed at the same time is detected as a multiply-accumulate operation valve; a switching element which is disposed in each of the memory cells, which is serially connected to the resistance change element between the corresponding input line and output line, and which is connected on the side closer to the input line than the resistance change element; and a MOS first transistor which is disposed in each of the memory cells and which is serially connected to the resistance change element on the side closer to the corresponding output line than the switching element.

Advantageous Effects of Invention

According to the present invention, the multiply-accumulate operation apparatus has such a configuration that the resistance change element, the switching element, and the MOS first transistor connected on the side closer to the output line than this switching element are serially connected to each other. Thereby, it is possible to sufficiently restrain a sneak current even when the electric potential of the output line decreases.

DESCRIPTION OF EMBODIMENTS

Figure 1:
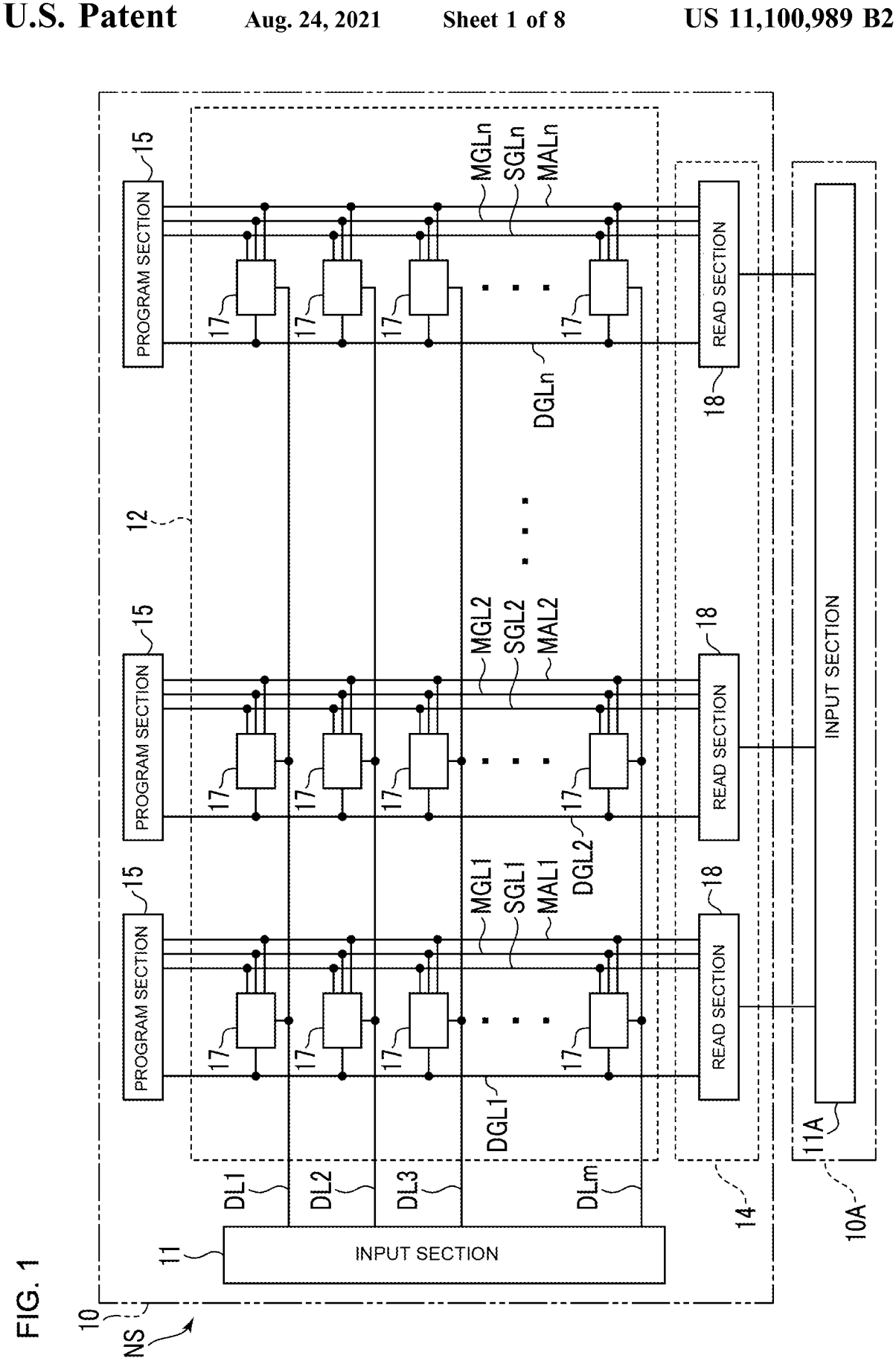
FIG. 1 is a block diagram illustrating a schematic neural network system.

In FIG. 1, a neural network system NS includes: a unit 10; and a unit 10A that comes after this unit 10. The unit 10 includes sections such as: an input section 11; a synapse operation section 12; a neuron section 14; and a program section 15. The unit 10A also has the same configuration. In addition, the neural network system NS includes a control section (not illustrated) that is configured to perform overall control on each part of the units 10 and 10A. In the neural network system NS, the synapse operation section 12 executes an operation of a multiply-accumulate operation value i.e. the sum of values obtained by weighting multiple input values by synaptic connection weights corresponding to the respective input values, and the neuron section 14 acquires the multiply-accumulate operation value.

The multiply-accumulate operation value acquired by the neuron section 14 of the unit 10 is output to an input section 11A of the following unit 10A. The neuron section 14 of this example binarizes the multiply-accumulate operation value, and outputs the resultant value to the input section 11A of the unit 10A. Note that, the neural network system NS of this example has the configuration in which the units are connected in two stages; instead, the system may have a configuration in which the units are connected in three or more stages, or alternatively, the unit is constituted of a single stage.

In the synapse operation section 12 of this example, multiple memory cells 17 are arranged in a matrix of m rows and n columns (e.g. 1024 rows and 1024 columns). In the m memory cells 17 of each column, the synaptic connection weights corresponding to the respective m input values are stored respectively. The synapse operation section 12 functions as a multiply-accumulate operation apparatus that is configured to output multiply-accumulate operation values for the respective columns. Accordingly, in this example, the synapse operation section 12 outputs n multiply-accumulate operation values for a set of m input values.

In the synapse operation section 12, input lines DL1, DL2, . . . DLm are arranged so as to correspond to the respective rows. Besides, sets of memory gate lines MGL1, MGL2, . . . MGLn, drain side gate lines DGL1, DGL2, . . . DGLn, source side gate lines SGL1, SGL2, . . . SGLn, and output lines MAL1, MAL2, . . . MALn are arranged so as to correspond to the respective columns.

In the following description, the input lines DL1, DL2, . . . DLm are collectively described as input lines DL unless otherwise distinguished from each other. Likewise, the memory gate lines MGL1, MGL2, . . . MGLn, the drain side gate lines DGL1, DGL2, . . . DGLn, the source side gate lines SGL1, SGL2, . . . SGLn, and the output lines MAL1, MAL2, . . . MALn are collectively described as lines MGL, DGL, SGL, and MAL respectively unless otherwise distinguished from each other. Note that, in this example, the source side gate lines SGL work as first control lines and the drain side gate lines DGL work as second control lines.

The input lines DL each extend in the direction in which the rows extend, and are each connected to the memory cells 17 of the corresponding row. Meanwhile, the memory gate lines MGL, the drain side gate lines DGL, the source side gate lines SGL, and the output lines MAL each extend in the direction in which the columns extend, and are each connected to the memory cells 17 of the corresponding column. In this manner, the synapse operation section 12 has a configuration, similar to that of a cross-point memory cell array, such that the multiple input lines DL and the multiple output lines MAL are arranged so as to intersect with each other and the memory cells 17 are respectively arranged at intersection points of the input lines DL and the output lines MAL.

The input section 11 outputs input signals as input values to the input lines DL, and thus inputs the input signals to the memory cells 17 via the input lines DL. The m input signals corresponding to a pair of input values are simultaneously output to the respective input lines DL from the input section 11. The input signals are generated based on information processing such as image processing.

The input signals are each a pulse signal that varies the electric potential of the input line DL in a pulse form with a pulse width determined according to the input value. In this example, the input values are set at binary ("1" and "0"). The input section 11 varies the electric potential of the input line DL with a predetermined pulse width if the input value is "1", and does not vary the electric potential of the input line DL with a pulse width set at "0" if the input value is "0". The electric potential of the input line DL is normally set at a power supply potential VDD, and is set at an electric potential V1 between a reference potential VSS (=0V) and the power supply potential VDD in response to the input value of "1". Here, in this example, the power supply potential VDD is 1.0V and the electric potential V1 is 0.4V.

In this example, the input values are set at binary as described above; instead, the input values may be analog or multi-level. In this case, the electric potential of the input line DL may be varied in a pulse form with a pulse width determined according to the magnitude of the input value which is analog or multi-level. It is also possible to vary the number of pulse signals with a constant pulse width instead of varying a pulse width according to the input value.

The memory cells 17 are configured to store synaptic connection weights in a non-volatile manner. As will be described later, each memory cell 17 includes a memory element 21 (see FIG. 2) which is a resistance change element with a variable electric resistance value. This memory element 21 stores a synaptic connection weight so that it indicates an electric resistance according to the magnitude of the synaptic connection weight. The larger the synaptic connection weight is, the smaller the resistance of the memory element 21 is. In response to a change in the electric potential of the input line DL, the memory element 21 restricts, with its resistance, an electric current flowing through the memory cell 17 from the output line MAL toward the input line DL (hereinafter referred to as a cell current). Accordingly, the larger the synaptic connection weight is, the larger cell current flows. The magnitude of the cell current flowing through one memory cell 17, or the amount of charge having flowed in a constant period of time by the cell current corresponds to the result obtained by multiplying the input value by the synaptic connection weight. Note that, in the case where the electric potential of the input line DL is set at a pulse signal with a pulse width determined according to the input value which is analog or multi-level as described previously, the amount of charge having flowed by the cell current with this pulse signal corresponds to the result obtained by multiplying the input value by the synaptic connection weight.

In this example, any of weight values W0 to W4 with a different magnitude is stored in the memory cell 17 as the synaptic connection weight. The weight values W0, W1, W2, W3, and W4 become larger in this order. The weight value W0 has a value of "0". In the memory cell 17 that stores the synaptic connection weight of this weight value W0, the memory element 21 exhibits an extremely high electric resistance, and thus little cell current flows through this memory cell. Specifically, the cell current of the memory cell 17 with the weight value W0 is around 10 pA, for example. In addition, the cell currents corresponding to the weight values W1, W2, W3, and W4 in this example are approximately 0.25 μA, 0.5 μA, 0.75 μA, and 1.0 ΞA, respectively. Note that, the synaptic connection weight is quinary in this example; instead, the synaptic connection weight may be binary, ternary, or quaternary, or may be senary or greater.

Through each output line MAL, the sum of cell currents flowing through the corresponding memory cells 17 that are connected to this output line flows. In other words, the electric current that flows through the output line is that equal to the multiply-accumulate operation value of the input values input to the corresponding memory cells 17 arranged in a line as input signals and the synaptic connection weights for these memory cells 17. As will be described later, this example employs a precharge method in which the capacitance of the output line MAL is precharged (charged) to a predetermined potential by a read section 18 and then a decrease in the electric potential of the output line MAL occurring when the input signals are input to the memory cells is detected. Thus, this example has a configuration of acquiring the magnitude of the decrease in the electric potential of the output line MAL as the multiply-accumulate operation value.

The program section 15 and the read section 18 are provided for every column of the synapse operation section 12. The read sections 18 are arranged in the neuron section 14. To each set of the program section 15 and the read section 18, the memory gate line MGL, the drain side gate line DGL, the source side gate line SGL, and the output line MAL of the corresponding column are connected.

The neural network system NS has: a program mode for storing the synaptic connection weights in the memory cells 17; and an operation mode for causing the synapse operation section 12 to execute multiply-accumulate operation. In the program mode, the program sections 15 and the input section 11 store the synaptic connection weights in the memory cells 17. In the program mode, the program sections 15 control the electric potentials of the memory gate lines MGL, the drain side gate lines DGL, the source side gate lines SGL, and the output lines MAL, and the input section 11 controls the electric potentials of the input lines DL. Values obtained by operation using an external computer, for example, are used as the synaptic connection weights.

When the system is in the operation mode, each read section 18 detects the multiply-accumulate operation value as a change in the electric potential of the output line MAL, and outputs a binary signal according to the multiply-accumulate operation value thus detected. The operation mode has a standby period, an operation period that follows the standby period, and a sense period that follows the operation period, and the standby period comes again after the sense period. The read section 18 precharges the output line MAL during the standby period before the input signals are input to the memory cells 17. In addition, the read section 18 detects, in the sense period, the electric potential of the output line MAL after the memory cells 17 with the input signals input thereto discharge the output line MAL by allowing the cell currents to flow therethrough and thereby decrease its electric potential during the operation period.

Figure 2:
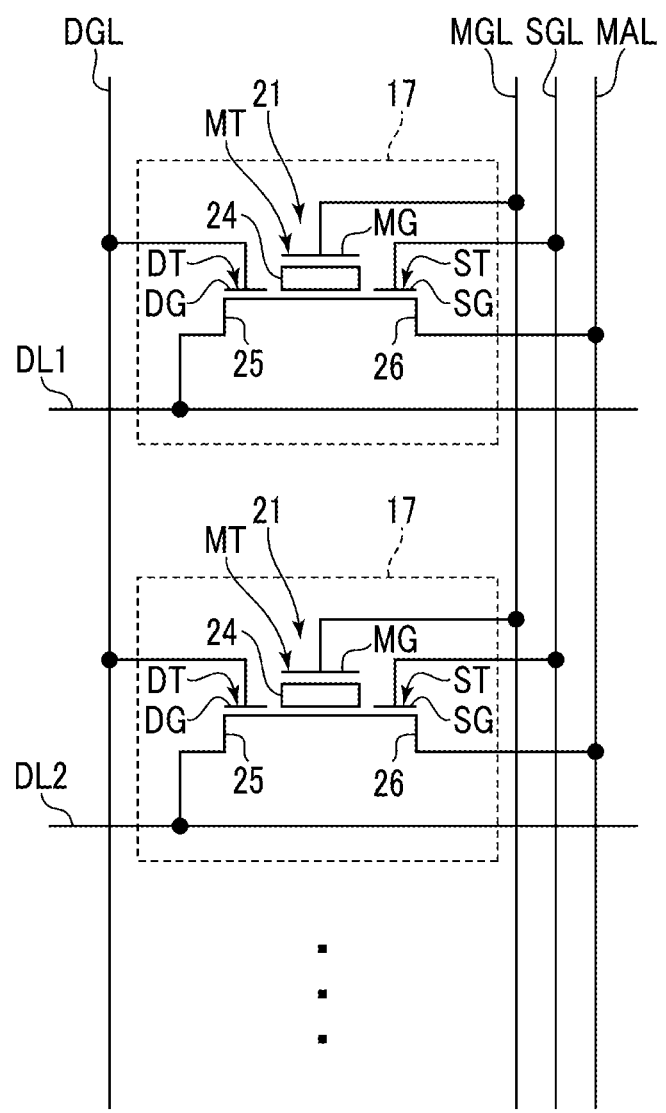
FIG. 2 is a circuit diagram illustrating the configuration of a memory cell.

In FIG. 2, the memory element 21 provided in each memory cell 17 has an integral structure in which a drain side MOS transistor (hereinafter referred to as a drain side transistor) DT, a memory MOS transistor (hereinafter referred to as a memory transistor) MT, and a source side MOS transistor (hereinafter referred to as a source side transistor) ST are connected in series. In the operation mode, in the memory cell 17 with an input value of "1", the cell current flows from the output line MAL toward the input line DL through the source side transistor ST, the memory transistor MT, and the drain side transistor DT.

In this memory element 21, a memory gate electrode MG of the memory transistor MT is connected to the memory gate line MGL, a drain side gate electrode DG of the drain side transistor DT is connected to the drain side gate line DGL, a source side gate electrode SG of the source side transistor ST is connected to the source side gate line SGL, respectively. In addition, a drain 25 of the memory element 21 is connected to the input line DL and a source 26 thereof is connected to the output line MAL, respectively. Note that, in this example, the source side transistor ST acts as a first transistor, and the drain side transistor DT acts as a switching element and also as a second transistor.

The memory transistor MT has a charge storage layer 24. In the program mode, charge is stored in this charge storage layer 24 of the memory transistor MT. By increasing or decreasing the amount of storage of charge in the charge storage layer 24, a threshold voltage of the memory transistor MT changes and an electric current that flows through the memory transistor MT increases or decreases when a constant electric potential is applied to the memory gate electrode MG. Thereby, the memory transistor MT functions as a resistance which is the synaptic connection weight. In the operation mode, an electric potential V2 is applied to the memory gate electrode MG through the memory gate line MGL. In this example, the electric potential V2 is 0.4V.

The operation period described above has a fixed length so that a combined MOS transistor constituted of the drain side transistor DT and the source side transistor ST connected in series may operate in a saturation region during this period. In other words, in the operation period, the difference between the drain potential of the combined MOS transistor (the electric potential of the source 26) and the electric potential of the input line DL (corresponding to a source-drain voltage in a typical MOSFET) is normally set larger than "the difference between the electric potential of the input line DL and that of the drain side gate electrode DG (corresponding to a gate-source voltage in a typical MOSFET)—a threshold of the drain side transistor DT".

The operation pattern of the synapse operation section 12 has a normal case where this section operates with the electric potential of the output line MAL near a reference potential Vref and a case where the electric potential of the output line MAL decreases greatly with respect to the reference potential Vref. The case where the electric potential of the output line MAL decreases greatly with respect to the reference potential Vref is, for example, a case where the inputs are nonuniform to a great extent and the many memory cells 17 for one column allow large cell currents corresponding to large synaptic connection weights to flow therethrough at the same time, in which case the electric potential of the output line MAL decreases rapidly. In this case, the combined MOS transistor transitions to a non-saturation region in the operation period; however, in such a case, since the electric potential of the output line MAL has already been decreased enough with respect to the reference potential Vref to be described later when the combined MOS transistor transitions to the non-saturation region, the current change of the combined MOS transistor after transition to the non-saturation region does not affect the binarized value of the multiply-accumulate operation value.

In the normal case, the combined MOS transistor constituted of the drain side transistor DT and the source side transistor ST operates in the saturation region during the operation period to stabilize the cell current, that is, to keep the cell current at a constant magnitude corresponding to the synaptic connection weight irrespective of a change in the electric potential of the output line MAL. In this example, the combined MOS transistor operates in the saturation region in the range of 1.0V to 0.8V to stabilize the cell current. In the operation mode, the drain side gate electrode DG of this combined MOS transistor is set at the power supply potential VDD which is an operation potential through the drain side gate line DGL. In the configuration using a MOS transistor, such as the combined MOS transistor, as a semiconductor element that allows an electric current to flow in one direction, it is possible to arrange many memory cells 17 since the ON/OFF current ratio between the ON state current and OFF state current for the drain side transistor DT that flow through the input line DL is large.

In the case where the electric potential of the output line MAL decreases greatly with respect to the reference potential Vref as described previously, the source side transistor ST prevents a sneak current from occurring due to the decrease in the electric potential of the output line MAL during the operation period. In the operation mode, the source side transistor ST is diode-connected by connection of the source side gate line SGL, to which the source side gate electrode SG is connected, and the output line MAL to which the source 26 is connected. This prevents a sneak current flowing in an opposite direction to the cell current from flowing through the memory cell 17, to which an input value of "0" is input from the input line DL, even when the electric potential of the output line MAL becomes lower than the electric potential of this input line DL, i.e. the power supply potential VDD. In this example, the threshold voltage of the combined MOS transistor is 0.4V which is the same as that of the drain side transistor DT, and the threshold voltage of the source side transistor ST is 0.2V.

The drain 25 and the source 26 of the memory element 21 are not particularly distinguished from each other and are interchangeable. In addition, the memory cell 17 may have such a configuration that the memory transistor MT, the drain side transistor DT, and the source side transistor ST are separately formed and connected in series.

Figure 3:
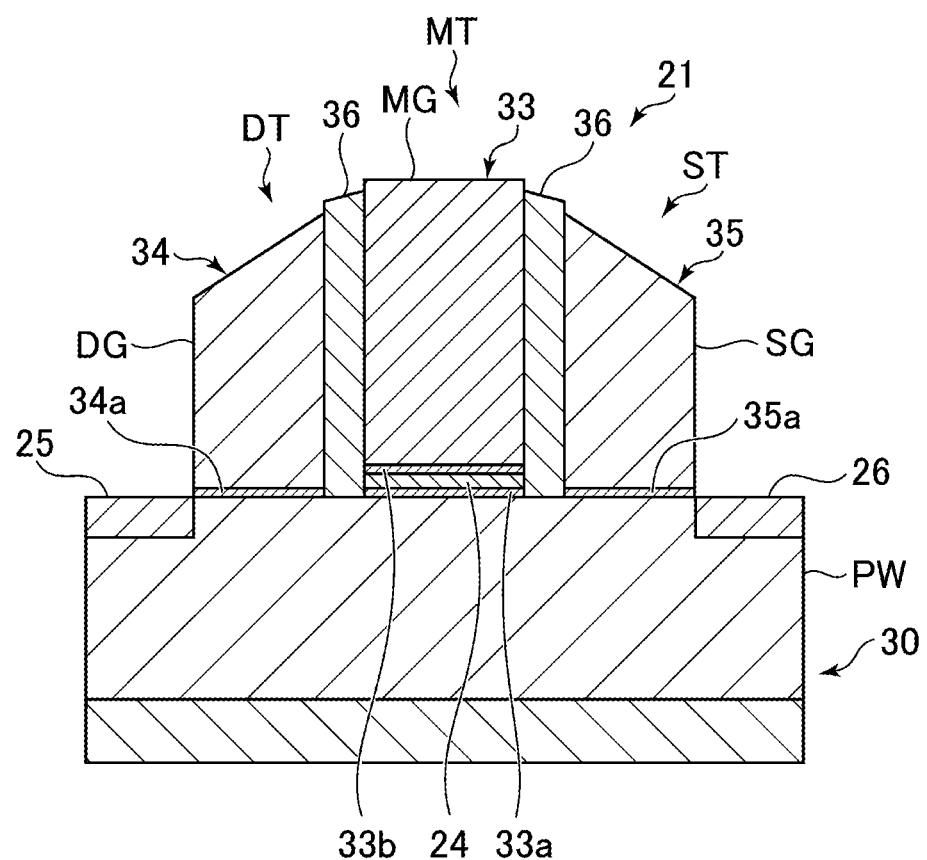
FIG. 3 is a sectional diagram illustrating the configuration of a memory element.

As FIG. 3 illustrates its sectional configuration, the memory element 21 is formed on a P-well PW formed in a semiconductor substrate 30. The memory transistor MT, the drain side transistor DT, and the source side transistor ST that are each an N-type MOSFET are arranged on the P-well PW.

The drain 25 and the source 26 of the memory element 21 are formed in a surface of the P-well PW as n-type semiconductor regions with a predetermined interval therebetween. On the P-well PW, a memory gate structure 33 is disposed between the drain 25 and the source 26, a drain side gate structure 34 is disposed between the memory gate structure 33 and the drain 25, and a source side gate structure 35 is disposed between the memory gate structure 33 and the source 26. Sidewall spacers 36 formed of an insulating material are disposed between the memory gate structure 33 and the drain side gate structure 34 and between the memory gate structure 33 and the source side gate structure 35, respectively.

The memory gate structure 33 constitutes the memory transistor MT. Meanwhile, the drain side gate structure 34 constitutes the drain side transistor DT and the source side gate structure 35 constitutes the source side transistor ST. Here, the source side gate structure 35 is a first gate structure, and the drain side gate structure 34 is a second gate structure.

In the memory gate structure 33, a lower memory gate insulating film 33a, the charge storage layer 24, an upper memory gate insulating film 33b, and the memory gate electrode MG are stacked one on top of another in this order from the P-well PW side. The charge storage layer 24 is formed of, for example, silicon nitride ($Si_3N_4$), silicon oxynitride (SiON), alumina ($Al_2O_3$) or the like.

In the drain side gate structure 34, a drain side gate insulating film 34a and the drain side gate electrode DG are stacked one on top of the other in this order from the P-well PW side. In the source side gate structure 35, a source side gate insulating film 35a and the source side gate electrode SG are stacked one on top of the other in this order from the P-well PW side. The memory gate electrode MG, the drain side gate electrode DG, and the source side gate electrode SG each extend in the direction in which the columns extend, and they constitute the memory gate line MGL, the drain side gate line DGL, and the source side gate line SGL, respectively. In this example, the P-well PW is set at the reference potential VSS in the program mode, and set at 0.4V in the operation mode.

The drain 25 is the drain of the memory element 21 and the drain of the drain side transistor DT at the same time, whereas the source 26 is the source of the memory element 21 and the source of the source side transistor ST at the same time. In addition, no regions corresponding to the source and drain of each of the transistors DT, MT, and ST are formed in portions of the P-well PW located between the drain side transistor DT and the memory transistor MT and between the source side transistor ST and the memory transistor MT.

The memory transistor MT described above is preferably of the so-called MONOS (Metal-Oxide-Nitride-Oxide-Silicon) type in which the memory gate structure 33 has such a structure that a silicon oxide film (the lower memory gate insulating film 33a), the charge storage layer 24 formed of a silicon nitride film for example, a block insulating film such as a silicon oxide film (the upper memory gate insulating film 33b), and the memory gate electrode MG are stacked one on top of another from the semiconductor substrate 30 side. The MONOS type transistor has a preferable structure because this transistor makes it possible to easily reduce the variability in threshold voltage between the memory transistors and to easily reproduce threshold voltages according to the amount of charge in the charge storage layer 24. The MONOS type transistor preferably includes a SONOS (Silicon-Oxide-Nitride-Oxide-Silicon) type transistor having a gate electrode formed of heavily-doped polysilicon, and more preferably is a SONOS type transistor. This is because, in the case where a silicon nitride film and the like is used for the charge storage layer 24, charge can be stored in the charge storage layer 24 discretely, and thus charge can be stored in a spatially uniform manner even when a local defect exists in a tunneling insulating film. Owing to this behavior, the difference in threshold voltage between the memory transistors at the time of storing charge in their charge storage layers under the same conditions is small and their reproducibility is stable, whereby the synaptic connection weights can be stored precisely.

Figure 4:
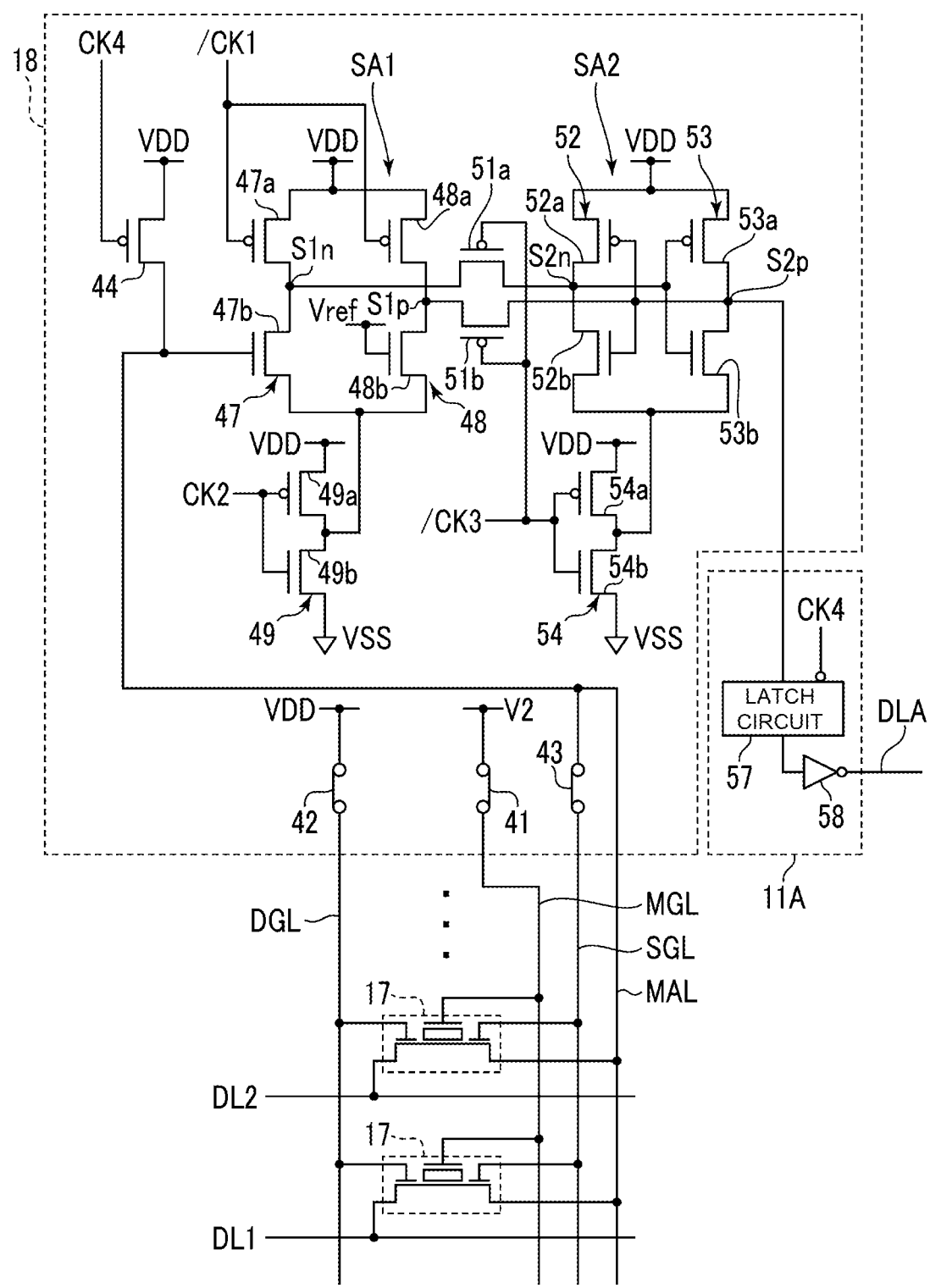
FIG. 4 is a circuit diagram illustrating the configuration of a read section.

As FIG. 4 illustrates one example, the read section 18 is constituted of: switching elements 41 to 43; a precharge transistor 44; a first sense amplifier section SA1; a second sense amplifier section SA2; and the like. The operation of this read section 18 is controlled by clock signals/CK1, CK2,/CK3, and CK4 supplied from the control section.

The switching elements 41 to 43 are each constituted of a MOSFET, for example, and controlled by the control section. The switching elements 41 to 43 get turned on in the operation mode. The memory gate line MGL is set at the electric potential V2 in response to the turn-on of the switching element 41. The drain side gate line DGL is set at the power supply potential VDD in response to the turn-on of the switching element 42. The switching element 43 is connected between the output line MAL and the source side gate line SGL. The source side gate line SGL and the output line MAL are electrically connected to each other in response to the turn-on of the switching element 43. Note that, during an OFF state, the switching elements 41 to 43 bring the source side gate line SGL, the drain side gate line DGL, and the memory gate line MGL into a grounded state or a floating state.

The switching element 42 is preferably capable of ON/OFF control on a per-column basis. Specifically, the switching element 42 is preferably capable of controlling ON/OFF of the drain side transistor DT on a per-column basis by controlling the electric potential of the drain side gate line DGL separately. This makes it possible to activate, for example, only specific columns, only odd columns, only even columns of the synapse operation section 12 that execute multiply-accumulate operation and thus to restrain the cell current from flowing through the memory cell 17 in which no multiply-accumulate operation is executed, thereby saving power consumption.

In the transistor 44 which is a P-type MOSFET, the source is set at the power supply potential VDD, and the drain is connected to the output line MAL. The clock signal CK4 is input to the gate of this transistor 44. The clock signal CK4 is set at L (Low) level (=0V) during the standby period, and set at H (High) level (=1.0V) during a period other than the standby period. Thereby, the transistor 44 gets turned on during the standby period to precharge the output line MAL to the power supply potential VDD. During this standby period, since the switching element 43 is turned on, the source side gate line SGL connected to the output line MAL is also precharged to the power supply potential VDD in response to the turn-on of the transistor 44.

The first sense amplifier section SA1 is a non-latch type differential current amplifier. This first sense amplifier section SA1 includes: transistors 47a and 48a; an input transistor 47b that corresponds to the electric potential of the output line MAL; an input transistor 48b that corresponds to the reference potential Vref; and a driving control circuit 49. The transistors 47a and 48a are each a P-type MOSFET whereas the input transistors 47b and 48b are each an N-type MOSFET.

In the first sense amplifier section SA1, the clock signal/CK1 is input to the gates of the transistors 47a and 48a. During the operation period in which the first sense amplifier section SA1 is not caused to operate, the clock signal/CK1 is set at L level to precharge the first sense amplifier section SA1 to the power supply potential VDD. Meanwhile, during the sense period in which the first sense amplifier section SA1 is caused to operate, the clock signal/CK1 is set at H level to stop pre-charging the first sense amplifier section SA1.

The output line MAL is connected to the gate of the input transistor 47b which is an amplifier main body of the first sense amplifier section SA1, and the reference potential Vref is input to the gate of the input transistor 48b. These input transistors 47b and 48b are configured to perform differential amplification based on comparison between the electric potential of the output line MAL and the reference potential Vref. The reference potential Vref is a threshold used at the time of binarizing the multiply-accumulate operation value, and is set at 0.9V in this example.

The driving control circuit 49 is constituted of: a transistor 49a which is a P-type MOSFET; and a transistor 49b which is an N-type MOSFET. In the driving control circuit 49, the drains of the transistors 49a and 49b are connected to each other to constitute an inverter logic circuit. The clock signal CK2 is input to each of the gates of the transistors 49a and 49b. The clock signal CK2 is set at H level during a short period in the first half of the sense period to drive the first sense amplifier section SA1, and is set at L level during a period other than this short period.

The driving control circuit 49 biases the electric potential of the common source of the input transistors 47b and 48b to the power supply potential VDD in response to an event where the clock signal CK2 is set at L level during a period other than the first half period of the sense period. Meanwhile, the driving control circuit 49 reduces the electric potential of the common source of the input transistors 47b and 48b to the reference potential VSS side in response to an event where the clock signal CK2 is set at H level only during the short period in the first half of the sense period. The input transistor 47b gets turned on based on the difference between the electric potential of the output line MAL and the electric potential of the common source, whereas the input transistor 48b gets turned on based on the difference between the reference potential Vref and the electric potential of the common source. The input transistors 47b and 48b operate as a differential circuit, and are configured to output amplified amplitude to connection points S1n and S1p.

The second sense amplifier section SA2 is connected to the first sense amplifier section SA1 with transistors 51a and 51b, which are each a P-type MOSFET, interposed therebetween. The transistors 51a and 51b are subjected to ON/OFF control in response to the clock signal/CK3, and disconnect the connection between the first sense amplifier section SA1 and the second sense amplifier section SA2 simultaneously with start of operation of the second sense amplifier section SA2.

The second sense amplifier section SA2 is a latch type sense amplifier, and constituted of: a cross-coupled latch that is formed of cross-coupled inverters 52 and 53; and a driving control circuit 54 that is configured to control the operation of this cross-coupled latch.

The inverter 52 is constituted of: a transistor 52a which is a P-type MOSFET; and a transistor 52b which is an N-type MOSFET. The drains of the transistors 52a and 52b are connected to each other, and the source of the transistor 52a is set at the power supply potential VDD. As in the case of the inverter 52, the inverter 53 is constituted of: a transistor 53a which is a P-type MOSFET; and a transistor 53b which is an N-type MOSFET that are connected to each other. The transistors 52b and 53b are common-source connected to each other, and their common source is connected to the driving control circuit 54.

The gates of the transistors 52a and 52b which are the inputs of the inverter 52 and connected to each other are connected to a connection point S2p to which the drains of the transistors 53a and 53b that are the outputs of the inverter 53 are connected. Meanwhile, the gates of the transistors 53a and 53b which are the inputs of the inverter 53 and connected to each other are connected to a connection point S2n to which the drains of the transistors 52a and 52b that are the outputs of the inverter 52 are connected. The connection point S2n is connected to the connection point S1n with the transistor 51a interposed therebetween, and the connection point S2p is connected to the connection point S1p with the transistor 51b interposed therebetween.

The driving control circuit 54 is constituted of: a transistor 54a which is a P-type MOSFET; and a transistor 54b which is an N-type MOSFET, and constitutes an inverter logic circuit. This driving control circuit has a connection configuration similar to that of the driving control circuit 49 except that the clock signal/CK3 is input to the gates of the transistors 54a and 54b. The clock signal/CK3 is also input to each of the gates of the transistors 51a and 51b. The clock signal/CK3 is set at H level during the second half period of the sense period and the standby period, and is set at L level during a period other than these periods.

During the second half period of the sense period, the second sense amplifier section SA2 amplifies the difference between the electric potential at the connection point S1n input to the connection point S2n and the electric potential at the connection point S1p input to the connection point S2p, and sets one of the connection point S2n and the connection point S2p at H level and sets the other at L level. The electric potential at the connection point S2p is output from the unit 10.

The read section 18 described above outputs the binarized multiply-accumulate operation value; instead, the output of the read section 18 may be multi-level. In this case, the electric potential of the output line MAL may be compared with multiple different reference potentials, for example. In addition, the multi-level multiply-accumulate operation value may be output as a pulse signal having a pulse width according to this value after having been subjected to pulse-width modulation according to the value, or as pulse signals whose number is determined according to this value.

A latch circuit 57 of the input section 11A of the unit 10A is configured to latch and output the electric potential at the connection point S2p when the sense period is over in response to the clock signal CK4. The output of the latch circuit 57 is output to an input line DLA of the unit 10A via an inverter 58 as an input signal in the unit 10A. The input signal in the unit 10A is set at H level if the electric potential of the output line MAL at the time of the end of the operation period is lower than the reference potential Vref, and set at L level if the electric potential of the output line MAL is equal to or higher than the reference potential Vref. The inverter 58 sets the input line DLA at the power supply potential VDD if the input signal is set at H level, and sets the input line DLA at the potential V1 if the input signal is set at L level.

Hereinbelow, a description is given of the programing of the synaptic connection weight in the program mode. Before programing in the program mode, the memory transistors MT are subjected to erase processing. Note that, in the erase processing in this example, electrons are extracted from the charge storage layer 24, and then holes are injected thereinto. This erase processing is executed by the program section 15 and the input section 11 in cooperation with each other.

In the erase processing, firstly, an erase potential (e.g. −12V) is applied to each memory gate electrode MG via the corresponding memory gate line MGL in the state where the electric potential of each of all the drain side gate lines DGL, source side gate lines SGL, input lines DL, output lines MAL, and P-wells PW is set at 0V. Thus, owing to the difference in electric potential between the memory gate electrode MG and the P-well PW and the quantum tunneling effect, electrons are extracted from the charge storage layer 24 toward the P-well PW, and then holes are injected thereinto. Note that, the memory transistor MT is disturbed when electrons are injected into the charge storage layer 24 for storing the synaptic connection weight therein; accordingly, for removing the influence from this disturbance, it is preferable to decrease the threshold voltage of the memory transistor MT enough by setting the erase potential application time longer than normal, for example.

Following the erase processing, while each memory cell 17 is selected, the synaptic connection weight of any of the weight values W0 to W4 is programed to the memory cell. In this program processing, the synaptic connection weight of any of the weight values W0 to W4 is programed to each of all the memory cells 17. Meanwhile, the stress of programing the weight value 0 is quite large and the influence from this disturbance is large in this case. Accordingly, if the weight value W0 is programed after the programing of the weight values W1 to W4, the amount of charge of each of the memory cells 17 with the weight values W1 to W4 varies, and the cell current (threshold voltage) sometimes deviates from a desired value. To deal with this, the memory cells 17 with the weight value W0 are firstly selected by turns and the synaptic connection weight taking the weight value W0 is programed to each of the selected memory cells 17, and then the programing to the memory cells 17 with the weight values W1 to W4 is performed. Since the order of programing of the weight values W1 to W4 does not particularly become an issue, the programing may be performed in such a way that the memory cells 17 are selected in the order in which the memory cells 17 are arranged or selected by turns for each of the weight values W1 to W4, for example.

For example, in the case where the programing is performed on the memory cell 17 in the x-th (x=1, 2, ... m) row and the y-th (y=1, 2, ... n) column, the electric potential of each drain side gate line DGL is set at 1.0V, the electric potential of each source side gate line SGL is set at 0V, the electric potential of each output line MAL is set at 1.2V, and the electric potential of the P-well PW is set at 0V. In addition, the electric potential of the input line DLx in the x-th row where the memory cell 17 to be programed is located is set at 0V, and the electric potential of each of the input lines DL in rows other than the x-th row is set at 1.2V. At this time, in the memory cell 17 in the x-th row and the y-th column, the drain side transistor DT gets turned on. In this state, the electric potential of the memory gate line MGLy in the y-th column is set at any of program potentials Vp0 to Vp4, determined according to the synaptic connection weight taking any of the weight values W0 to W4, only for a predetermined period. The electric potential of each of the memory gate lines MGL other than that in the y-th column is set at 0V.

Here, the larger the synaptic connection weight is, the lower each of the program potentials Vp0 to Vp4 is. In this example, the program potential Vp0 corresponding to the weight value W0 is set at 12V, the program potential Vp1 corresponding to the weight value W1 is set at 8V, the program potential Vp2 corresponding to the weight value W2 is set at 7.5V, the program potential Vp3 corresponding to the weight value W3 is set at 7.0V, and the program potential Vp4 corresponding to the weight value W4 is set at 6.5V.

In the memory transistor MT inside the memory cell 17 located in the x-th row and the y-th column, electrons are injected into the charge storage layer 24 by the difference in electric potential between the memory gate electrode MG and the P-well PW. At this time, the number of electrons injected into the charge storage layer 24 is determined according to the difference in electric potential. Accordingly, in the memory transistor MT inside the memory cell 17 located in the x-th row and the y-th column, the amount of charge stored in the charge storage layer 24 varies depending on the program potential applied and becomes the amount corresponding to any of the synaptic connection weights taking the weight values W0 to W4. Thereby, the smaller the synaptic connection weight is, the higher the threshold voltage of the memory transistor MT becomes.

On the other hand, in each of the memory cells 17 in the y-th column, which is the same as the column the memory cell 17 to be programed is located, other than the memory cell 17 to be programed, the application of the electric potential as described above turns off the drain side transistor DT and the source side transistor ST. In this state, when any of the program potentials Vp0 to Vp4 is applied to the memory gate electrode MG of each of the memory cells 17 in the y-th column other than the memory cell 17 to be programed, a depletion layer is formed by the application of this program potential inside the P-well PW located below the memory gate structure 33. The capacitive coupling of this depletion layer and the memory gate structure 33 increases the electric potential of the surface of the P-well PW located below the memory gate structure 33, and thus reduces the difference in the electric potential between the memory gate electrode MG and the P-well PW. As a result, no injection of electrons into the charge storage layer 24 occurs.

Meanwhile, in each of the memory cells 17 other than those in the y-th column, since the electric potential of the memory gate electrode MG is 0V and the electric potential of the P-well PW is 0V, the difference in electric potential between the memory gate electrode MG and the P-well PW is 0V or substantially 0V. For this reason, no injection of electrons into the charge storage layer 24 due to the quantum tunneling effect occurs.

Accordingly, only the amount of charge in the charge storage layer 24 inside the memory cell 17 to be programed located in the x-th row and the y-th column becomes the amount corresponding to any of the synaptic connection weights taking the weight values W0 to W4, and there is no change in the amount of charge in the charge storage layer 24 inside each memory cell 17 other than the above memory cell 17. Note that, it is preferable to execute verification and trimming so that the target cell current corresponding to any of the weight values W1 to W4 may flow.

In each of the memory cells 17 excluding the memory cells 17 with the synaptic connection weight of the weight value W0, the difference in electric potential is caused to generate between the memory gate electrode MG and the P-well PW to change the amount of charge in the charge storage layer 24 according to the same procedure as above. In this manner, each memory cell 17 is set in the state where the synaptic connection weight taking any of the weight values W0 to W4 is stored therein.

In the above case, the amount of charge in the charge storage layer 24 is changed by the magnitude of the difference in electric potential between the memory gate electrode MG and the P-well PW; instead, using the same difference in electric potential, the amount of charge may be changed by increasing or decreasing its application period.

Next, the behavior of the above configuration is described. Note that, when the neural network system NS is used, the synaptic connection weight is stored in each memory cell 17 in advance.

Figure 5:
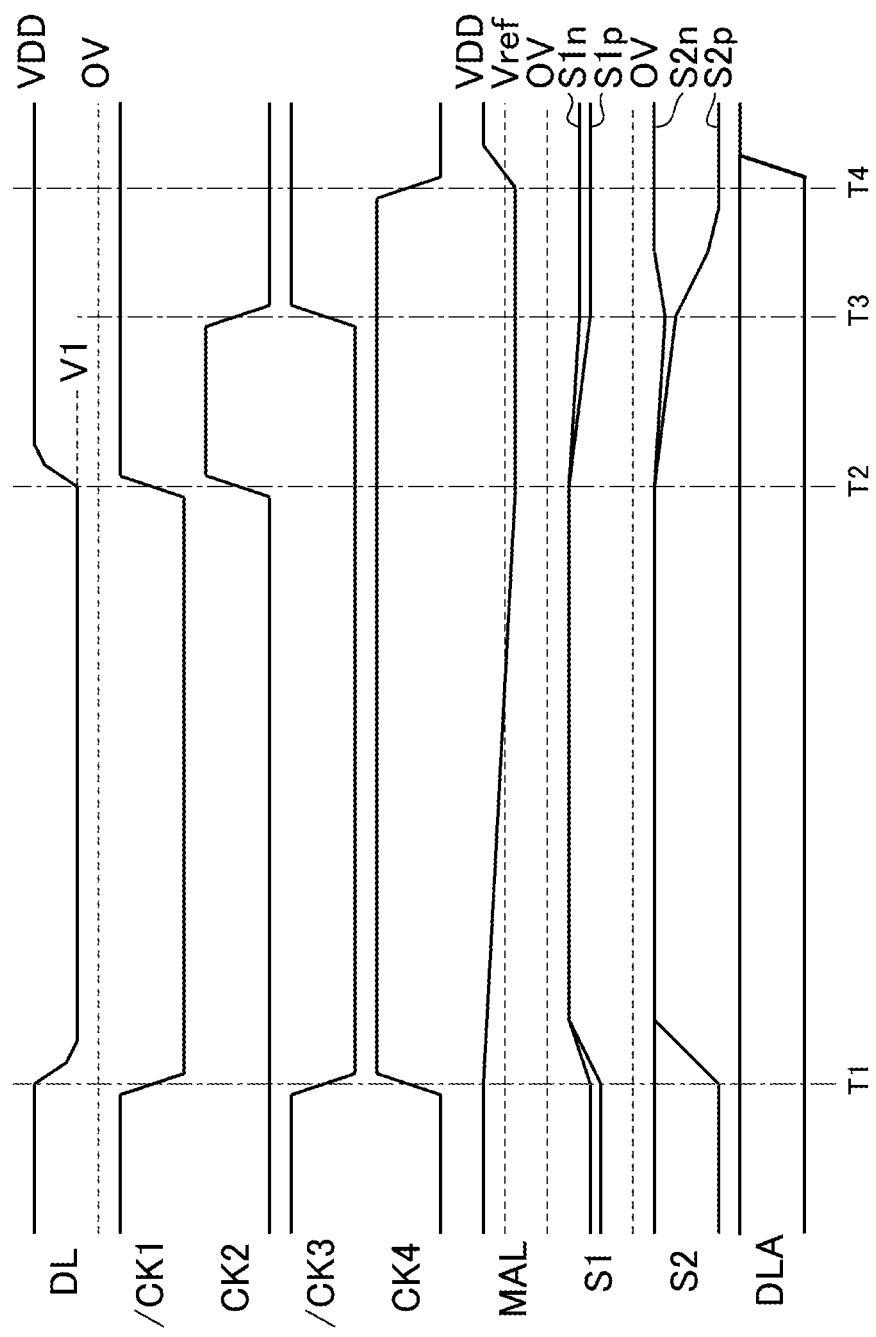
FIG. 5 is a timing chart illustrating a change in the electric potential of each part of the read section observed when the speed of decrease of the electric potential of an output line is high.
Figure 6:
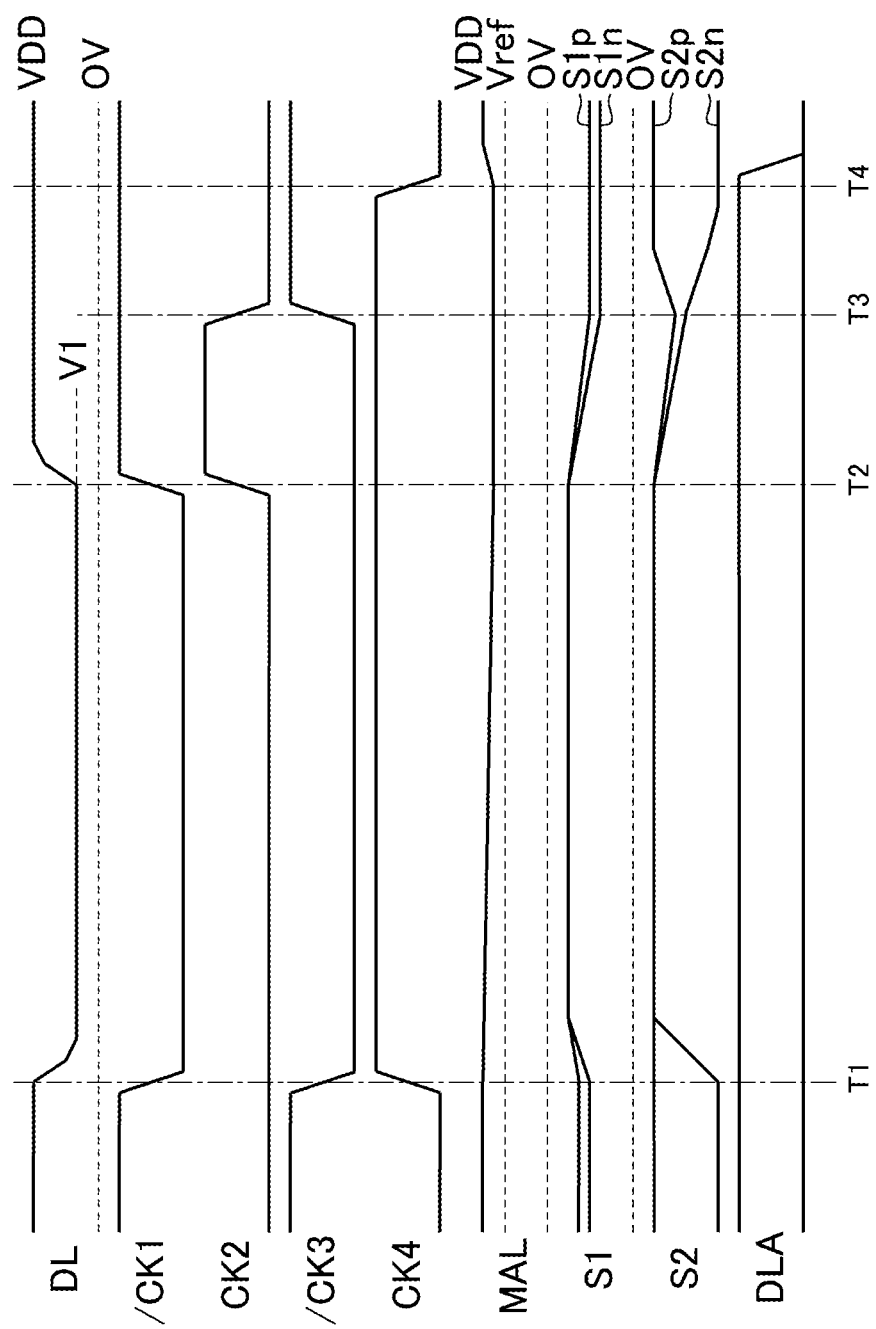
FIG. 6 is a timing chart illustrating a change in the electric potential of each part of the read section observed when the speed of decrease of the electric potential of the output line is low.

In the operation mode, the electric potential of the P-well PW is set at 0.4V. As illustrated in FIGS. 5 and 6, during the standby period before time T1 at which an input signal is output from the input section 11, the input line DL is set at H level. In addition, since the switching elements 41 to 43 get turned on, the memory gate line MGL is set at the electric potential V2, the drain side gate line DGL is set at the power supply potential VDD, and the source side gate line SGL has the same electric potential as the output line MAL. Further, the clock signals /CK1 and /CK3 are set at H level, and the clock signals CK2 and CK4 are set at L level.

Since the transistor 44 gets turned on owing to the clock signal CK4 set at L level, the output line MAL is set at the power supply potential VDD. Specifically, since the clock signal CK4 is set at L level, the transistor 44 gets turned on, and the output line MAL is precharged to the power supply potential VDD and keeps this state. Since the source side gate line SGL is connected to the output line MAL via the switching element 43, it is also precharged to the power supply potential VDD in response to the turn-on of the transistor 44 as in the case of the output line MAL.

In the memory element 21 of any memory cell 17, the drain side gate electrode DG has the same electric potential as the drain side gate line DGL, the drain 25 has the same electric potential as the input line DL, the source side gate electrode SG has the same electric potential as the source side gate line SGL and the output line MAL, and the source 26 has the same electric potential as the output line MAL. During the standby period, since the drain side gate line DGL, the input line DL, the source side gate line SGL, and the output line MAL are all set at the power supply potential VDD, both the drain side transistor DT and the source side transistor ST are turned off and hence no cell current flows therethrough.

At the time T1, input signals are output to the respective input lines DL from the input section 11, and the operation period comes in which the synapse operation section 12 executes multiply-accumulate operation. The input signals are each input via the corresponding input line DL to the memory cells 17 connected to the input line DL. In response to this input signal, if the input value is "1", the electric potential of the input line DL decreases in a pulse form from the power supply potential VDD to the electric potential V1. On the other hand, if the input value is "0", the electric potential of the input line DL is kept at the power supply potential VDD.

When focusing on one memory cell 17, if the input value is "1" for example, i.e. if the input line DL connected to this memory cell is set at the electric potential V1, the drain 25 of the memory element 21 inside this memory cell 17 is set at the electric potential V1. As a result, the drain side transistor DT and the source side transistor ST get turned on. Here, if the charge storage layer 24 of the memory transistor MT stores the amount of charge corresponding to the synaptic connection weight taking any of the weight values W1 to W4, the cell current flows from the output line MAL toward the input line DL via the source side transistor ST, the memory transistor MT, and the drain side transistor DT. The magnitude of the cell current at this time depends on the amount of charge stored in the charge storage layer 24. Accordingly, the larger the synaptic connection weight is, the larger cell current flows through the memory cell 17. Note that, if the charge storage layer 24 of the memory transistor MT stores the amount of charge corresponding to the weight value W0, no cell current flows through the memory cell 17 since the threshold voltage is quite high and the memory transistor MT gets turned off.

Due to the cell current flowing through this memory cell 17, the electric potential of the output line MAL connected to this memory cell 17 is decreased from the power supply potential VDD. Needless to say, the electric potential of the output line MAL is also decreased by the cell current flowing through other memory cells 17 connected to this output line. The electric potential of an end part of the source side transistor ST on the memory transistor MT side (hereinafter referred to as an intermediate potential) is also decreased together with the electric potential of the output line MAL because it is lower than the electric potential of the output line MAL by the amount of the threshold voltage of the source side transistor ST and the threshold voltage of the memory transistor MT. At least in a range where the electric potential of the output line MAL is close to the reference potential Vref and precise variation in the magnitude of the electric potential of the output line MAL is required, the combined MOS transistor operates in the saturation region. For this reason, the magnitude of the electric current flowing through the source side transistor ST i.e. the magnitude of the cell current depends on the difference in electric potential between the drain 25 and the drain side gate electrode DG (corresponding to a gate-source voltage (Vgs) in a typical connection of MOSFET), and there is little influence from the variation of the intermediate potential. Accordingly, in the memory cell 17 with the input value of "1", a constant cell current corresponding to the synaptic connection weight flows during the operation period. In a situation where a large electric current flows through the output line MAL and the electric potential of the output line MAL is decreased to a value near the electric potential V1, the combined MOS transistor operates in the non-saturation region during the operation period owing to the effect of the diode-connected source side transistor ST and the cell current is decreased. However, when a situation enters a phase where the combined MOS transistor operates in the non-saturation region in this manner, the electric potential of the output line MAL is already decreased enough with respect to the reference potential Vref. Thus, this does not affect a binarized signal that is output later by binarizing the multiply-accumulate operation value.

On the other hand, if the input value is "0" i.e. if the electric potential of the input line DL connected to the memory cell is kept at the power supply potential VDD, the electric potential of the source side gate electrode SG of the source side transistor ST and that of the source 26 are the same as the electric potential of the output line MAL, and changed to a value decreased with respect to the electric potential of the input line DL. Accordingly, no cell current or sneak current flows through this memory cell 17.

More specifically, in the case of the memory cell 17 with the input value of "1", when the electric potential of the output line MAL varies between 1.0V and 0.8V during the operation period, the combined MOS transistor of this memory cell 17 operates in the saturation region, and thus a stable cell current flows during the operation period. Meanwhile, if a large cell current flows through the multiple memory cells 17 connected to the same output line MAL and the electric potential of the output line MAL, that is, the electric potential of the source 26 of each of the memory cells 17 with the input value of "1" that are connected to this output line MAL is decreased to 0.8V or lower, the combined MOS transistor of this memory cell 17 transitions to the non-saturation region and thus the cell current changes. However, at this point of time, the electric potential of the output line MAL is already decreased enough with respect to the reference potential Vref, which determines a binarized signal obtained by binarizing the multiply-accumulate operation value. Accordingly, this does not disturb the multiply-accumulate operation function.

Meanwhile, in the case of the memory cell 17 with the input value of "0", if a large cell current flows through the multiple memory cells 17 connected to the common output line MAL and the electric potential of the source 26 of each memory cell, that is, the electric potential of the output line MAL is decreased to 0.8V or lower, the electric potential of the source side gate line SGL is also decreased, whereby the source side transistor ST performs a diode-mode operation. Since the diode effect of this source side transistor ST makes it possible to stop an electric current flowing from the input line DL to the output line MAL and thus to prevent the flow of a sneak current, this does not disturb the multiply-accumulate operation function.

In this manner, through each of the memory cells 17, the cell current flows whose magnitude corresponding to the result obtained by multiplying the synaptic connection weight stored in the memory cell by the input value input into the memory cell. When focusing on one output line MAL, this output line is discharged by an electric current with a magnitude corresponding to the sum of cell currents flowing through the memory cells 17 connected to this output line i.e. the multiply-accumulate operation value. Since the transistor 44 gets turned off in response to an event where the clock signal CK4 turns to H level at the start of this operation period, the one output line MAL having been precharged is discharged by an electric current corresponding to the multiply-accumulate operation value of the corresponding column, and its electric potential is decreased from the power supply potential VDD gradually with the rate determined according to the magnitude of this electric current.

On the other hand, in the first sense amplifier section SA1, during the operation period, each of the transistors 47a and 48a gets turned on in response to the clock signal/CK1 set at L level. Hence, the electric potential at each of the connection points S1n and S10p is precharged to substantially the same electric potential as the power supply potential VDD. In addition, the electric potential at each of the connection points S2n and S2p in the second sense amplifier section SA2 is also precharged via the transistors 51a and 51b which get turned on.

At time T2 when the operation period is over and (the first half of) the sense period starts, the input section 11 sets each of the input lines DL at the power supply potential VDD, which stops the discharge of the output lines MAL by the memory cells 17. In addition, at the time T2, each of the clock signals/CK1 and CK2 is set at H level. In response to the change of these clock signals/CK1 and CK2, each of the transistors 47a and 48a gets turned off to end precharge, and the transistor 49b gets turned on to turn on each of the input transistors 47b and 48b. In this manner, the first sense amplifier section SA1 is put into operation, and each of the input transistors 47b and 48b allows a drain current corresponding to the electric potential of the corresponding gate to flow therethrough.

As a result, the electric potential at the connection point S1n is decreased gradually with a decreasing rate determined according to the electric potential of the output line MAL immediately after the start of the sense period, and the electric potential at the connection point S1p is decreased gradually with a decreasing rate determined according to the reference potential Vref. The electric potential of each of the connection points S2n and S2p is also decreased along with the decrease in electric potential at the connection points S1n and S1p. Here, the lower the electric potential of the output line MAL is, the lower the decreasing rate of the electric potential at the connection point S1n is. In addition, if the electric potential of the output line MAL is lower than the reference potential Vref, the decreasing rate of the electric potential at the connection point S1n becomes smaller than the connection point S1p and, if the electric potential of the output line MAL is higher than the reference potential Vref, the decreasing rate of the electric potential at the connection point S1n becomes larger than the connection point S1p. The lower the electric potential of the output line MAL is, the smaller the decreasing rate of the electric potential at the connection point S1n is.

Accordingly, as illustrated in FIG. 5, if the electric potential of the output line MAL immediately after the start of the sense period is lower than the reference potential Vref, the electric potential at the connection point S1n is higher than the electric potential at the connection point S1p; meanwhile, as illustrated in FIG. 6, if the electric potential of the output line MAL immediately after the start of the sense period is higher than the reference potential Vref, the electric potential at the connection point S1n is lower than the electric potential at the connection point S1p.

At time T3 when the first half period of the sense period ends after the lapse of a predetermined period since the time T2 and the second half period starts, the clock signal/CK3 is set at H level. In response to this, the transistor 54a gets turned off and the transistor 54b gets turned on to start the operation of the second sense amplifier section SA2, and the transistors 51a and 51b get turned off to disconnect the electrical connection between the connection point S1n and the connection point S2n and the electrical connection between the connection point S1p and the connection point S2p. Here, simultaneously with the timing when the clock signal/CK3 is set at H level, the clock signal CK2 turns to L level and, in response to this, the transistor 49a gets turned on and the transistor 49b gets turned off to stop the first sense amplifier section SA1.

When the second sense amplifier section SA2 starts to operate, the difference in electric potential between the connection point S2n and the connection point S2p is amplified, which turns one of the connection point S2n and the connection point S2p to H level and turns the other to L level. Then, at time T4 after one of the connection point S2n and the connection point S2p turns to H level and the other turns to L level in this manner, the clock signal CK4 turns to L level and the period returns to the standby period.

In response to an event where the clock signal CK4 turns to L level, the electric potential at the connection point S2p at this point of time is latched by the latch circuit 57 of the input section 11A of the following unit 10A. Then, an input signal based on the latched signal is output to the input line DLA inside the unit 10A through the inverter 58.

Accordingly, as illustrated in FIG. 5, if the electric potential of the output line MAL is lower than the reference potential Vref, the connection point S2p turns to L level, and the value of "0" (the power supply potential VDD) is output to the input line DLA of the following unit through the inverter 58 as a value obtained by binarizing the multiply-accumulate operation value. Meanwhile, as illustrated in FIG. 6, if the electric potential of the output line MAL is higher than the reference potential Vref, the connection point S2p turns to H level, and the value of "1" (the electric potential V1) is output to the input line DLA of the following unit through the inverter 58 as a value obtained by binarizing the multiply-accumulate operation value.

As described above, the result of multiply-accumulate operation executed by the synapse operation section 12 corresponds to the magnitude of an electric current flowing through the output line MAL. Since high stability of the cell current flowing through the memory cell 17 with the input value of "1" is secured and a sneak current is prevented from flowing through the memory cell 17 with the input value of "0", it is possible to prevent a decrease in the precision of the multiply-accumulate operation value which is detected as a decrease in the electric potential of the output line MAL. In addition, since there is no influence from a sneak current, even when multiple multiply-accumulate operation procedures are executed at the same time, it is possible to execute the operation precisely and stably.

Figure 7:
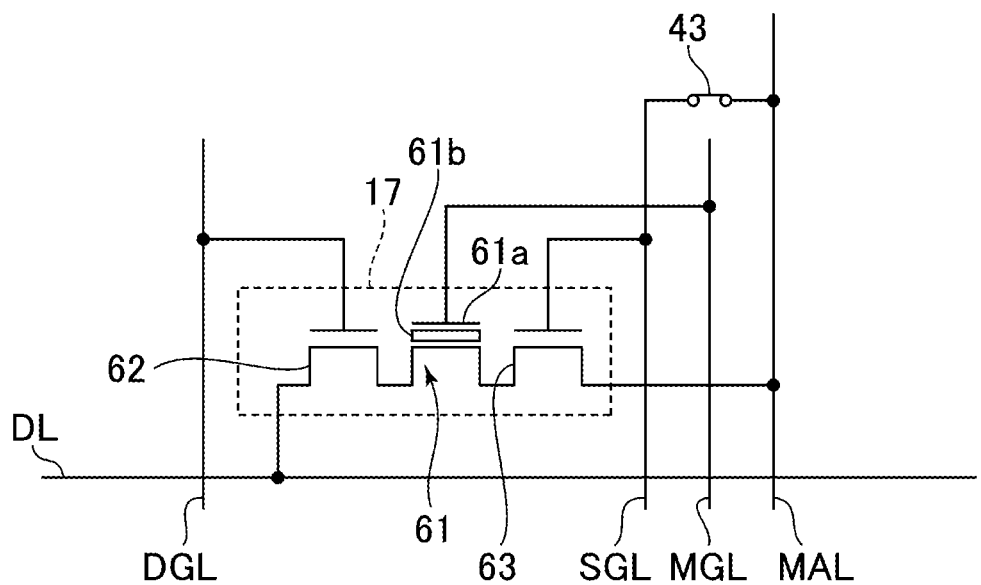
FIG. 7 is a circuit diagram illustrating an example of a memory cell constituted of three independent transistors.

In the above embodiment, the memory element integrally including the memory transistor, the first transistor, and the second transistor is used; instead, these transistors may be provided as individual elements. For example, in an example illustrated in FIG. 7, the memory element 17 is constituted of a series circuit in which a memory transistor 61, a transistor 62, and a transistor 63 that are individual elements are connected in series. The memory transistor 61 has a memory gate electrode 61a and a charge storage layer 61b and, in the program mode, stores the amount of charge corresponding to the synaptic connection weight in the charge storage layer 61b. The source of the transistor 62 is connected to the drain of the memory transistor 61, and the drain of the transistor 63 is connected to the source of the memory transistor 61. The memory transistor 61 and the transistors 62 and 63 described above correspond respectively to the memory transistor MT, the drain side transistor DT, and the source side transistor ST, respectively. Here, the transistor 63 is the first transistor and the transistor 62 is the second transistor.

Figure 8:
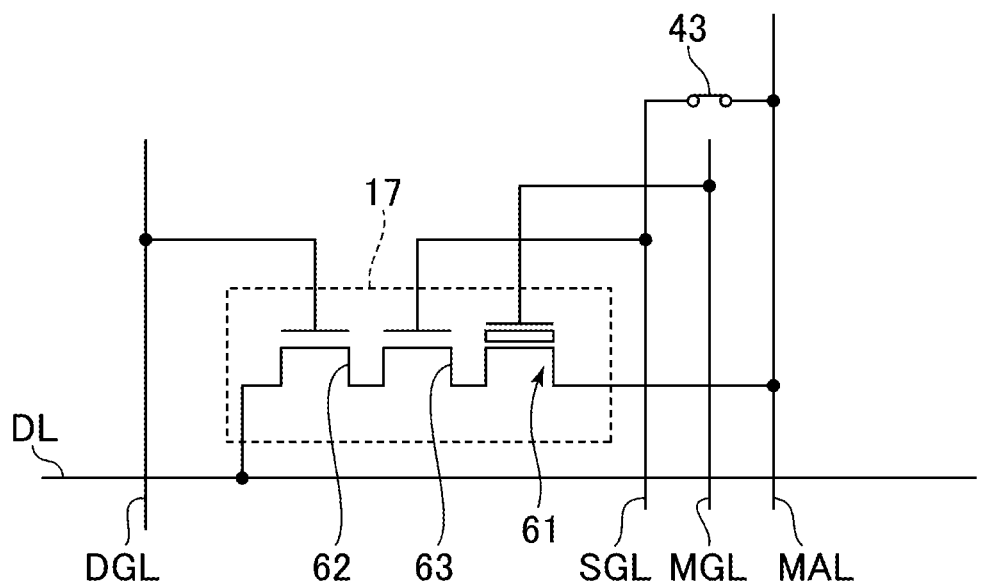
FIG. 8 is a circuit diagram illustrating an example of a memory cell with a different order of connection of transistors.
Figure 9:
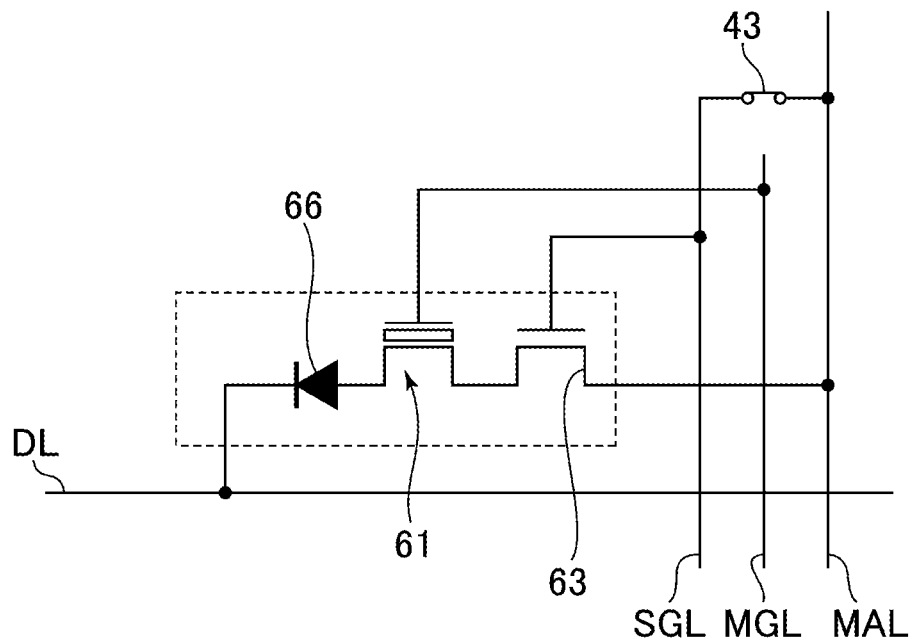
FIG. 9 is a circuit diagram illustrating an example in which a second transistor is replaced with a diode.

The order of connection of the memory transistor, the first transistor, and the second transistor is not limited to the above. For example, as illustrated in FIG. 8, the transistor 62, the transistor 63, and the memory transistor 61 may be connected in series in this order from the input line DL side. Meanwhile, as illustrated in FIG. 9, the memory cell may have such a configuration that a diode 66 instead of the second transistor is connected to the memory transistor 61 and the transistor 63 which is the first transistor in series. A diode-connected MOS transistor may be used instead of the diode 66. Note that, the configuration of connecting the first transistor on the side closer to the output line than the memory transistor as in the first example makes it possible to reduce the parasitic capacitance of the first control line (source side gate line) and shorten the time to turn off the first transistor, so that it is advantageous in terms of high-speed operation and power consumption reduction.

Figure 10:
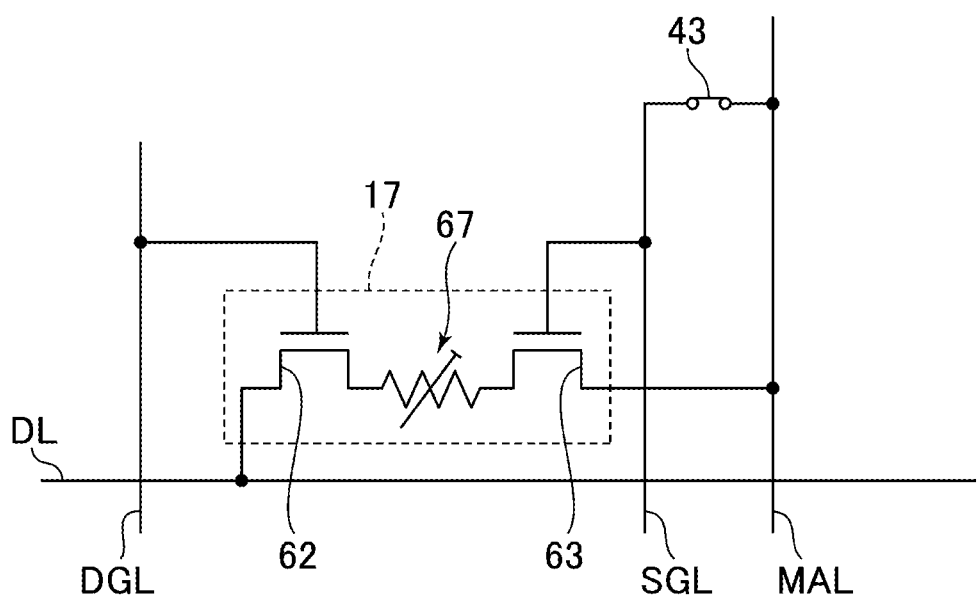
FIG. 10 is a circuit diagram illustrating an example in which a resistance change element is replaced with a ReRAM.

The resistance change element is not limited to the memory transistor having the charge storage layer and, as illustrated in FIG. 10, it may be a ReRAM (resistive random access memory) 67 for example.

REFERENCE SIGNS LIST

12: synapse operation section, 17: memory cell, 18: read section, 21: memory element, 24: charge storage layer, DGL1 to DGLn: drain side gate line, DL1 to DLm: input line, DT: drain side transistor, NS: neural network system, MAL1 to MALn: output line, MGL1 to MGLn: memory gate line, MT: memory transistor, PW: P-well, SGL1 to SGLn: source side gate line, ST: source side transistor.

What is claimed is:

1. A multiply-accumulate operation apparatus comprising:
    a plurality of memory cells each of which has a resistance change element with a variable resistance value and which are arranged in a matrix of rows and columns;
    a plurality of input lines which are arranged so as to correspond to the respective rows and each of which is connected to the memory cells in the corresponding row;
    a plurality of output lines which are arranged so as to correspond to the respective columns, each of which is connected to the memory cells in the corresponding column, and in each of which the magnitude of an electric current that flows therethrough when electric potentials of the plurality of input lines are changed at the same time is detected as a multiply-accumulate operation value;
    a switching element which is disposed in each of the memory cells, which is serially connected to the resistance change element between the corresponding input line and output line, and which is connected on the side closer to the input line than the resistance change element; and
    a first transistor which is MOS type which is disposed in each of the memory cells and which is serially connected to the resistance change element on the side closer to the corresponding output line than the switching element.

2. The multiply-accumulate operation apparatus according to claim 1, further comprising a plurality of first control lines which are arranged so as to correspond to the respective columns and each of which is connected to a gate of the first transistor of each of the memory cells in the corresponding column and to the output line of the corresponding column.

3. The multiply-accumulate operation apparatus according to claim 1, wherein the switching element is a second transistor which is MOS type.

4. The multiply-accumulate operation apparatus according to claim 3, further comprising a plurality of second control lines which are arranged so as to correspond to the respective columns and each of which is connected to a gate of the second transistor of each of the memory cells in the corresponding column and configured to apply an operation potential to the gate of the second transistor.

5. The multiply-accumulate operation apparatus according to claim 4, wherein, among the plurality of second control lines, the second control line corresponding to the column of the output line, in which no multiply-accumulate operation value is detected, is controlled not to apply the operation potential to the gate of each of the second transistors connected to the second control line.

6. The multiply-accumulate operation apparatus according to claim 1, wherein the first transistor is connected on the side closer to the output line than the resistance change element.

7. The multiply-accumulate operation apparatus according to claim 1, wherein the resistance change element is a memory transistor which includes a memory gate electrode and a charge storage layer.

8. The multiply-accumulate operation apparatus according to claim 3, wherein each of the memory cells is constituted of:
    a drain and a source which are formed in a surface of a P-well;
    a memory gate structure which includes a charge storage layer and a memory gate electrode, which is disposed on the surface of the P-well at a position between the drain and the source, and which forms the resistance change element that is configured to change a threshold voltage according to the amount of storage of charge in the charge storage layer;
    a first gate structure which is disposed on the surface of the P-well at a position between the memory gate structure and the source and which forms the first transistor; and
    a second gate structure which is disposed on the surface of the P-well at a position between the memory gate structure and the drain and which forms the second transistor.

9. The multiply-accumulate operation apparatus according to claim 8, wherein
    the charge storage layer is any of a silicon nitride ($Si_3N_4$) film, a silicon oxynitride (SiON) film, and an alumina ($Al_2O_3$) film, and
    the memory gate structure has such a structure that a silicon oxide film, the charge storage layer, a silicon oxide film, and the memory gate electrode are stacked one on top of another from the P-well side.

10. The multiply-accumulate operation apparatus according to claim 1, further comprising a read section which is configured to precharge each of the output lines to a predetermined potential and detect an electric potential of the output line observed after electric potentials of the plurality of input lines are changed at the same time.

* * * * *